(12) United States Patent
O'Brien

(10) Patent No.: US 6,285,564 B1
(45) Date of Patent: Sep. 4, 2001

(54) CIRCUIT CARD RETAINER ASSEMBLY

(75) Inventor: Kevin G. O'Brien, Alhambra, CA (US)

(73) Assignee: Keystone Electronics Packaging, Inc., Alhambra, CA (US)

( * ) Notice: Subject to any disclaimer, the term of this patent is extended or adjusted under 35 U.S.C. 154(b) by 0 days.

(21) Appl. No.: 09/535,447

(22) Filed: Mar. 24, 2000

(51) Int. Cl.$^7$ .................. H05K 7/14; H05K 7/20
(52) U.S. Cl. ............. 361/801; 361/759; 361/802; 361/807; 439/327; 403/24
(58) Field of Search .................. 361/728, 736, 361/740, 741, 753, 756, 759, 796, 797, 801, 802, 807, 704; 165/80.3, 185; 403/24, 409.1; 211/41.17; 439/327

(56) References Cited

U.S. PATENT DOCUMENTS

| | | | |
|---|---|---|---|
| 3,845,359 | * | 10/1974 | Fedele . |
| 3,908,508 | * | 9/1975 | Payne . |
| 4,298,904 | * | 11/1981 | Koenig . |
| 4,352,274 | * | 10/1982 | Anderson et al. . |
| 4,459,639 | * | 7/1984 | Heil et al. . |
| 4,473,263 | * | 9/1984 | Sunstein . |
| 4,695,923 | * | 9/1987 | Abraham . |
| 4,751,963 | * | 6/1988 | Bui et al. . |
| 4,775,260 | * | 10/1988 | Kecmer . |
| 4,819,713 | * | 4/1989 | Weisman . |
| 4,850,896 | * | 7/1989 | Smith et al. . |
| 4,909,752 | * | 3/1990 | Hallum et al. . |
| 4,934,884 | * | 6/1990 | Rooke . |
| 4,935,847 | * | 6/1990 | Welsh . |
| 4,953,059 | * | 8/1990 | McNulty . |
| 4,976,358 | * | 12/1990 | Stickel et al. . |
| 5,036,428 | * | 7/1991 | Brownhill et al. . |
| 5,145,381 | * | 9/1992 | Volz . |
| 5,240,361 | * | 8/1993 | Armstrong et al. . |
| 5,407,297 | * | 4/1995 | Hulme et al. ............. 403/409.1 |
| 5,472,353 | * | 12/1995 | Hristake et al. . |
| 5,485,353 | * | 1/1996 | Hayes et al. . |
| 5,859,764 | * | 1/1999 | Davis et al. . |

OTHER PUBLICATIONS

Article entitled "Camioc Fastener Technology Sets New Standards for P.C. Board Access" from P.C. Board Fasteners, Selector Guide (date unknown).*

* cited by examiner

*Primary Examiner*—Jayprakash N. Gandhi
(74) *Attorney, Agent, or Firm*—Sheldon & Mak; Denton L. Anderson

(57) ABSTRACT

The invention is a retainer assembly that, upon being attached to a panel and placed in a slot in a housing, provides a smooth and continuous surface that allows the panel to slide freely in and out of the housing. The panel can be firmly retained within the housing slot by expanding the width of the retainer assembly. The retainer assembly provides a more uniform heat transfer surface when abutted against the housing slot. The retainer assembly is self-contained to prevent the individual components from becoming dispersed if the assembly is damaged or disassembled. Additionally, retainer assembly provides a mechanism to prevent it from accidentally disassembling.

20 Claims, 3 Drawing Sheets

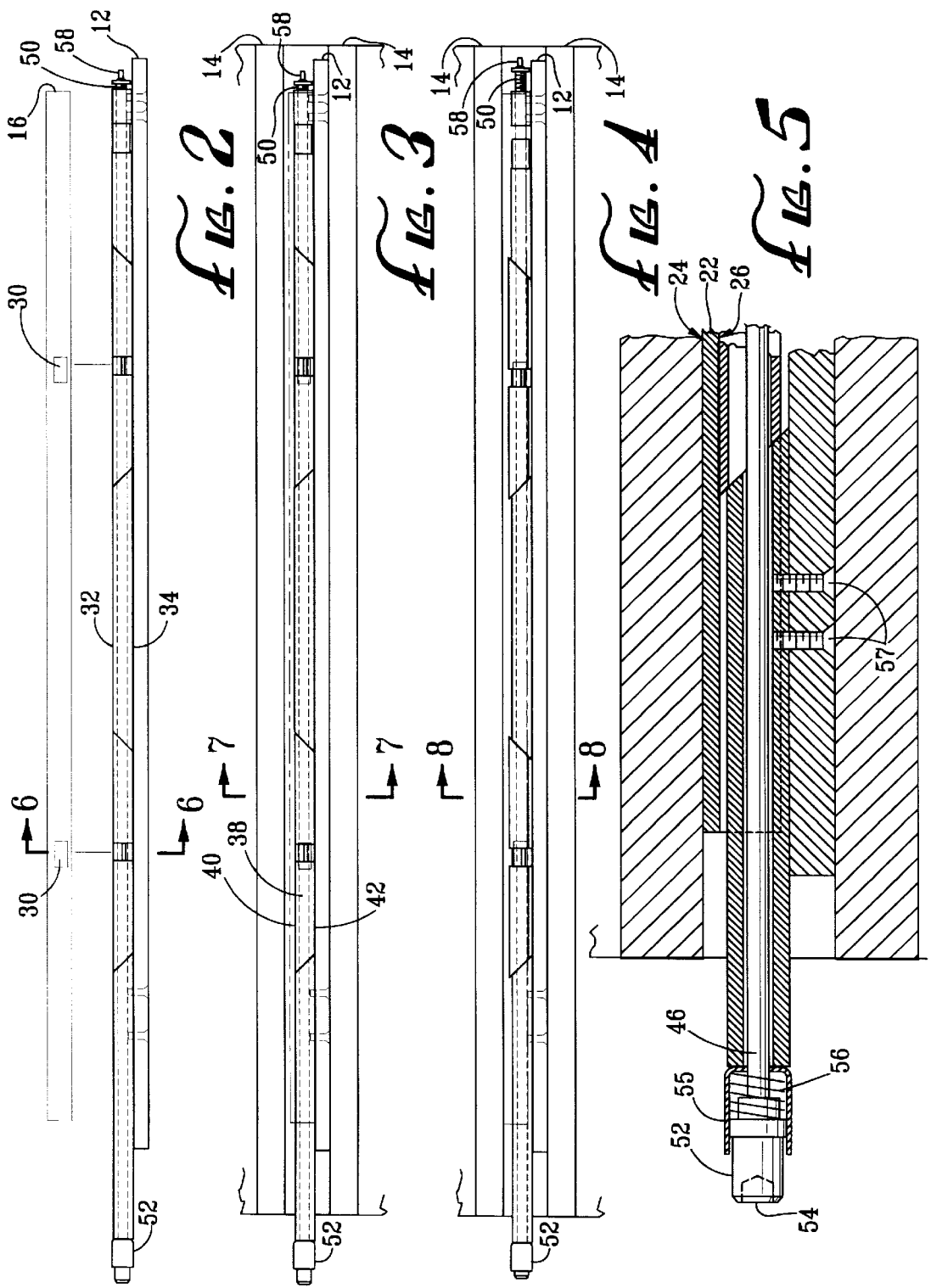

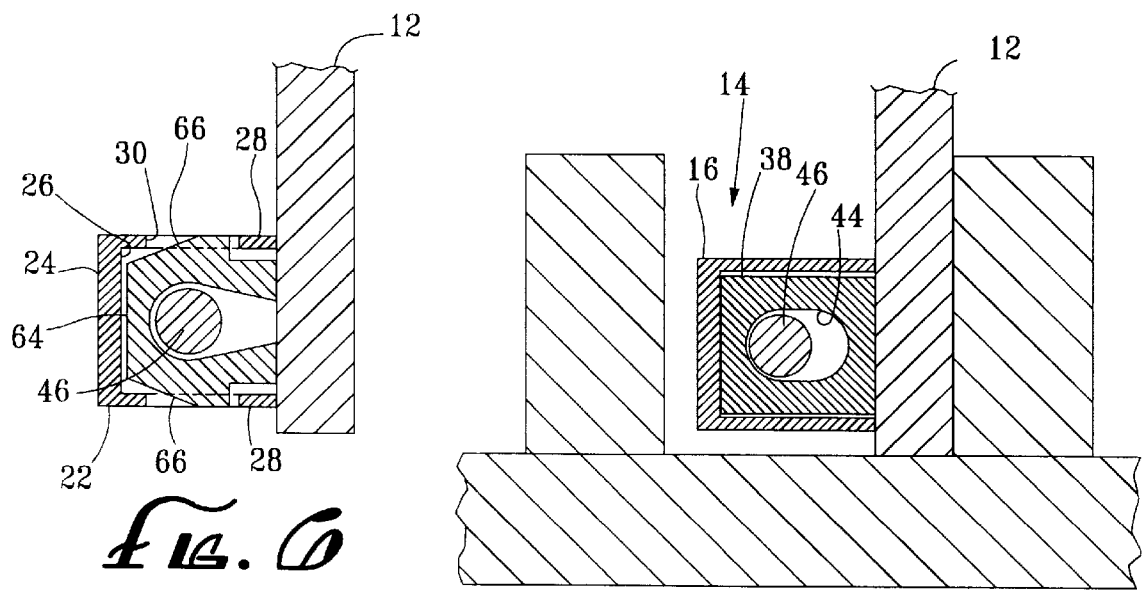
FIG. 6
FIG. 7
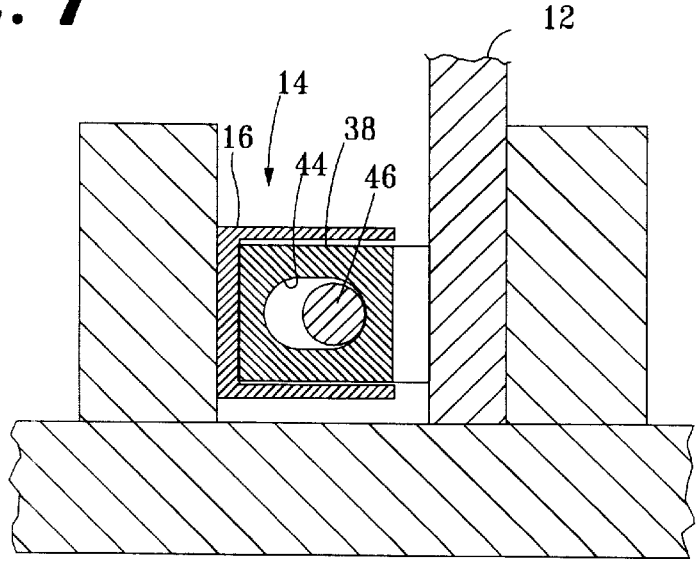
FIG. 8

CIRCUIT CARD RETAINER ASSEMBLY

FIELD OF THE INVENTION

This invention relates generally to retainer assemblies, and more specifically to circuit board retainer assemblies.

BACKGROUND OF THE INVENTION

Retainer assemblies have been developed for a broad range of applications, such as for reversibly clamping panels and circuit boards attached to the panels within a housing.

With some applications, it is important that the circuit board retainer insulate and dampen the circuit board from shock and vibration. For other applications, an important feature of the circuit board retainer is to effectively transfer heat generated by the circuit board through the panel and to the housing to which the panel is mounted. In these applications, the retainer assembly and the panel are made from heat conductive materials. The heat transfer is effective only between surfaces of the retainer assembly and the housing that are in direct contact, and the amount of heat transfer is directly proportional to the amount of shared surface area. Additionally, the heat transfer is more effective when a greater amount of force is applied between the housing and the retainer assembly.

A problem with prior art retainer assemblies is that they have a discontinuous surface that abuts against the housing slot. The surface is discontinuous because these prior art retainer assemblies have a plurality of wedge components that expand within the housing slot upon engaging an actuator screw that causes the wedge components to slide together. The wedge components form a rough and discontinuous surface that tends to catch against the housing slot as the panel slides into and out of the slot. This makes installation and servicing of the panels within the housing difficult because the panels do not smoothly slide in and out of the housing slots.

Another problem with prior art retainer assemblies is that they distribute heat unevenly because the wedge components form a discontinuous surface having only partial segments in direct contact with the housing assembly. This can cause the panel to have a discontinuous heat distribution pattern which can adversely effect electronic circuitry attached to the panel.

Still another drawback with prior art retainer assemblies is that they are not self contained when attached to a panel. Prior art retainer assemblies have a plurality of individual components that are interconnected but which are not encased by a housing or analogous structure. Accordingly, if a prior art retainer assembly is damaged and its individual components become disengaged, the components will be free to move about within the housing. Additionally, prior art retainer assemblies can become disengaged if the actuator screw is unscrewed too much. Again, the components will be free to move about within the housing. In either of the above scenarios, the disengaged retainer assembly components may disrupt the operation of the circuit boards within the housing.

There is therefore a need for a retainer assembly that, when attached to a panel and placed in a slot in a housing, provides a smooth and continuous surface that allows the panel to slide freely in and out of the housing. There is also a need for a retainer assembly that provides a more uniform heat transfer surface when abutted against the housing slot. There is also a need for a retainer assembly that is self-contained such that, if damaged, the components are not free to move out of the assembly. Finally, there is a need for a retainer assembly that has a mechanism to prevent it from accidentally disassembling.

SUMMARY

The invention satisfies this need. The invention is a retainer assembly adapted to attach to a panel that reversibly mounts within a housing slot. The retainer assembly has an elongated guide rail having a slot abutment wall. The slot abutment wall has a continuous external surface and an opposed internal surface. The retainer assembly includes an expansion assembly having a forward wail and a rearward wall. The forward wall is spaced apart from the rearward wall of the expansion assembly by a width. The forward wall of the expansion assembly is disposed proximate to the internal surface of the guide rail. The rearward wall of the expansion assembly includes means for attaching the rear wall to a panel that is adapted to having a circuit board attached thereto. The retainer assembly further comprises an expansion actuator for alternatively expanding and contracting the width between the forward wall and the rearward wall of the expansion assembly.

In a preferred embodiment, two retainer assemblies are attached to a panel with the rearward wall of the expansion assembly disposed in abutment with the panel. The panel is slid into a housing slot with the external surface of the guide rail disposed proximate to the housing slot. The panel can be firmly retained within the housing slot by expanding the width between the forward wall and the rearward wall of the expansion assembly until the external surface of the slot abutment wall of the guide rail is pressed tightly against the housing slot.

DRAWINGS

These features, aspects and advantages of the present invention will become better understood with regard to the following description, appended claims and accompanying figures where:

FIG. 2 is a side view of the retainer assembly of FIG. 1 shown attached to a panel;

FIG. 3 is a side view of the retainer assembly of FIG. 1 shown attached to a panel disposed within a housing slot, with the expansion assembly of the retainer assembly being in a contracted position;

FIG. 4 is a side view of the retainer assembly of FIG. 1 shown attached to a panel disposed within a housing slot, with the expansion assembly of the retainer assembly being in an expanded position;

FIG. 5 is a cross-sectional view of the retainer assembly illustrated in FIG. 4;

FIG. 6 is a cross-sectional view of the retainer assembly illustrated in FIG. 2, taken along line 6—6;

FIG. 7 is a cross-sectional view of the retainer assembly illustrated in FIG. 3, tan along line 7—7; and FIG. 8 is a cross-sectional view of the retainer assembly illustrated in FIG. 3, taken along line 8—8.

DETAILED DESCRIPTION

Figure 1:
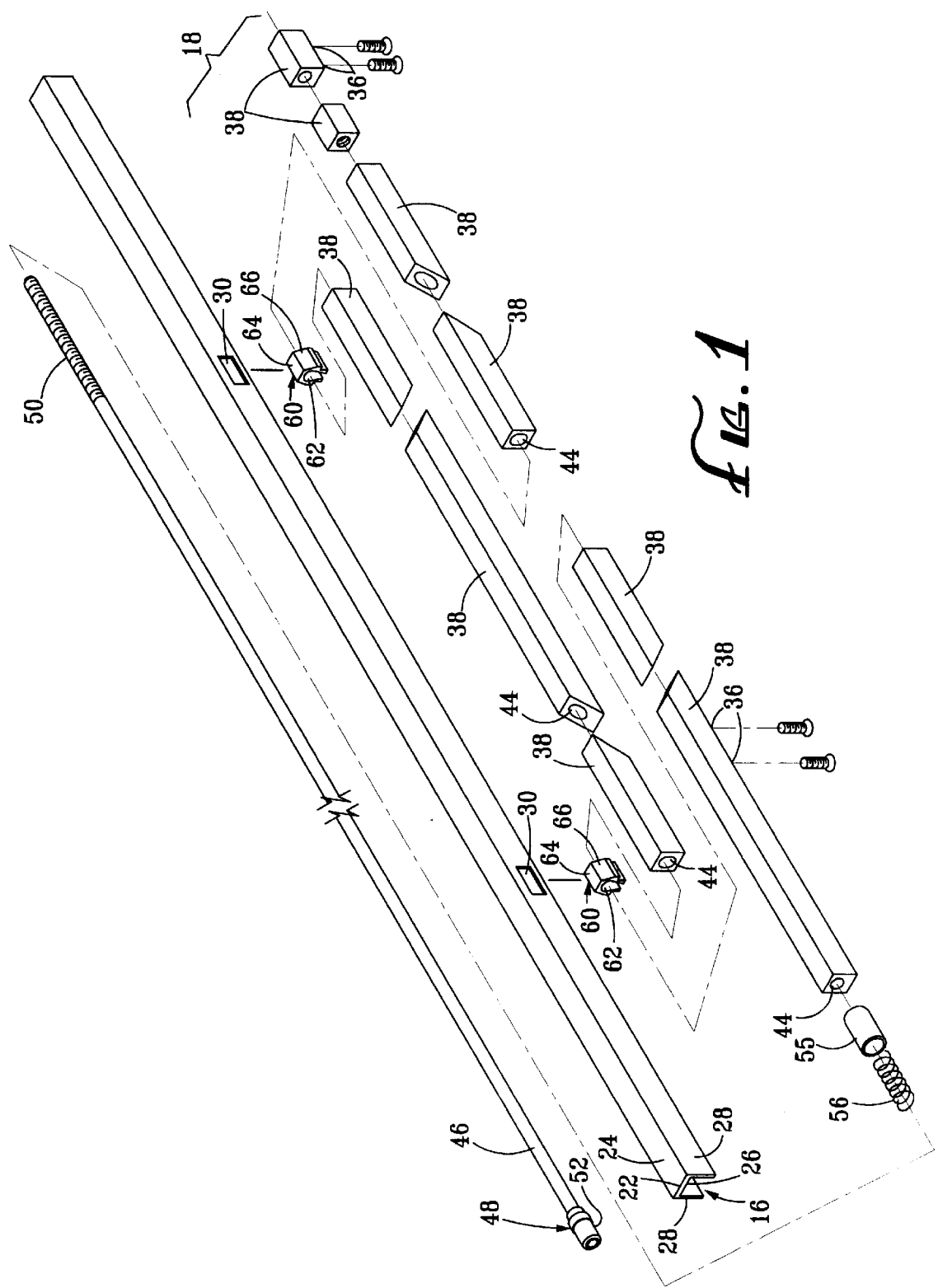
FIG. 1 is an isometric view of a retainer assembly having features of the invention.

The following discussion describes in detail one embodiment of the invention and several variations of that embodiment. This discussion should not be construed, Id however, as limiting the invention to those particular embodiments.

Practitioners skilled in the art will recognize numerous other embodiments as well.

The invention is a retainer assembly 10 adapted to attach to a panel 12 that is capable of reversibly mounting within a housing slot 14. As shown in the embodiment illustrated in the Figures, the retainer assembly 10 comprises an elongate guide rail 16, an expansion assembly 18, and an expansion actuator 20.

The guide rail 16 has a slot abutment wall 22 having a continuous external surface 24 and an opposed internal surface 26. In the embodiment illustrated in the drawings, the guide rail 16 includes two opposing side walls 28 that are attached to the slot abutment wall 22 such that the guide rail 16 is substantially U-shaped in cross-section so as to form an elongate channel. The width of the slot abutment wall 22 is typically between about 0.20 inches and about 1.0 inches and the width of each side wall 28 is between about 0.20 inches and about 1.0 inches. In the embodiment illustrated in the drawings, the width of the slot abutment wall 22 is about 0.25 inches and the width of each side wall 28 is about 0.25 inches. The length of the retainer assembly 10 is typically between about 1.5 inches and about 20 inches. In the embodiment illustrated in the drawings, the length of the retainer assembly 10 is about 14 inches.

Upon attachment of the retainer assembly 10 to a panel 12, the slot abutment wall 22 of the guide rail 16 is disposed spaced apart from the panel 12 and the internal surface 26 of the slot abutment wall 22 faces toward the panel 12. In the embodiment illustrated in the drawings, the slot abutment wall 22 is disposed away from the panel 12 by at least a distance equivalent to the width of the side walls 28. The distance between the panel 12 and the slot abutment wall 22 of the expansion assembly 18 when the expansion assembly 18 is attached to the panel 12 varies according to the width of the expansion assembly 18.

In a preferred embodiment, the side walls 28 of the guide rail 16 have two sets of opposed side wall openings 30. As illustrated in FIG. 1, the side wall openings 30 are generally rectangular and disposed spaced apart from each other.

Preferably, the guide rail 16 is formed of a thermally conductive material such as a metal or a metal alloy.

The expansion assembly 18 moves between a contracted position and an expanded position. As the expansion assembly 18 moves to the expanded position, it applies force to the internal surface 26 of the slot abutment wall 22. The expansion assembly 18 has a forward wall 32 and a rearward wall 34 that is spaced apart from the rearward wall 34 by a width. The forward wall 32 of the expansion assembly 18 is disposed proximate to the internal surface 26 of the guide rail 16. The rearward wall 34 of the expansion assembly 18 includes means for attachment of the expansion assembly 18 to a panel 12. In the embodiment illustrated in the Figures, the expansion assembly 18 is disposed substantially within a U-shaped guide rail 16.

Preferably, the expansion assembly 18 is formed of a thermally conductive material such as a metal or a metal alloy. In a preferred embodiment, the expansion assembly 18 and the guide rail 16 have a surface coating such as nickel plating that can be applied by conventional techniques such as electroless plating or anodized plating.

In a preferred embodiment, the rearward wall 34 of the retainer assembly 10 includes mounting members 36 for attaching the retainer assembly 10 to a panel 12. As illustrated in FIG. 5, the rearward wall 34 of the expansion assembly 18 has threaded holes 36 that serve as the mounting members 36 and the retainer assembly 10 can be attached to the panel 12 by screws 37 passing through the panel 12 and into the threaded holes 36 in the rearward wall 34 of the expansion assembly 18. As illustrated in FIG. 5, is when the expansion assembly 18 is attached to a panel 12 and placed in a housing slot 14, the rearward wall 34 of the expansion assembly 18 is disposed proximate to the panel 12 and the external surface 24 of the slot abutment wall 22 is disposed proximate to the housing slot 14.

In a preferred embodiment, the expansion assembly 18 comprises slidably engaging wedged block components 38. Each block component has a forward face 40 and a spaced apart rearward face 42. As illustrated in FIGS. 6–8, the forward face 40 of the block components 38 is disposed proximal to the internal surface 26 of the guide rail 16 and the forward wall 32 of the expansion assembly 18 is formed by the forward face 40 of several block components 38. As illustrated in FIG. 3, the forward wall 32 and rearward wall 34 of the expansion assembly 18 are discontinuous and portions of the forward wall 32 may be disposed more proximal to internal surface 26 of the slot abutment wall 22. As illustrated in FIG. 2, the rearward wall 34 of the expansion assembly 18 is formed by the rearward face 42 of several block components 38.

In the embodiment illustrated in the drawings, the block components 38 are substantially rectangular in cross-section and each block component 38 has two opposing end surfaces. Preferably, at least two of the block components 38 have at least one wedged end surface and the wedged end surfaces of the block components 38 are in abutment and disposed end-to-end such that they are in sliding contact with each other.

As illustrated in FIG. 1 and FIGS. 6–8, each block component 38 has a block hole 44 extending longitudinally through the block component 38. As illustrated in FIG. 7 and FIG. 8, several of the block components 38 have block holes 44 that are elongated between the forward face 40 of the block component 38 and the rearward face 42 of the block component 38. In the embodiment illustrated in the drawings, one block component 38 has a circular block hole 44 and another block component 38 has a threaded circular block hole 44. As illustrated in FIG. 1, two of the block components 38 have threaded holes 36 on their rearward face 42 that serve as the mounting members 36 for attaching the retainer assembly 10 to a panel 12.

The expansion actuator 20 is in operable connection with the expansion assembly 18 and functions to alternatively expand and contract the width between the forward wall 32 and the rearward wall 34 of the expansion assembly 18. In the embodiment illustrated in the drawings, engagement of the expansion actuator 20 causes at least two wedged block components 38 to slide together such that the forward faces 40 of two block components 38 and the rearward faces 40 of at least two block components 38 are discontinuous and the width of the expansion assembly 18 is increased. The width of the expansion assembly 18 is the greatest distance between the discontinuous forward wall 32 of the expansion assembly 18 and the discontinuous rearward wall 34 of the expansion assembly 18, which is also the greatest distance between forward face 40 of a block component 38 and the rearward face 42 of another block component 38.

In the embodiment illustrated in the drawings, the expansion actuator 20 comprises an actuator screw 46. As illustrated in FIG. 7 and FIG. 8, the actuator screw 46 passes through the block holes 44 in the block components 38. When the retainer assembly 10 is attached to a panel 12, the actuator screw 46 is spaced apart from the panel 12 by a fixed distance as a result of the actuator screw 46 passing through block components 38 having substantially circular block holes 44 that are only slightly larger than the actuator screw 46. As illustrated in FIG. 7 and FIG. 8, block components 38 having elongated block holes 44 are capable of moving relative to the fixed actuator screw 46.

The actuator screw 46 has a first opposed end 48 and a second opposed end 50. As illustrated in FIG. 5, the first opposed end 48 of the actuator screw 46 includes a screw head member 52 that is incapable of passing through the block hole 44 of the most proximal block component 38. The screw head member 52 has an alien is wrench opening 54 that allows the actuator screw 46 to be turned by an alien type tool. In alternative embodiments (not shown), the screw head member 52 has an opening which accommodates a screwdriver and the actuator screw 46 can be turned by a screwdriver.

As illustrated in FIG. 1, a screw head flange 55 is disposed between the screw head member 52 and the most proximal block component 38 The screw head flange 55 is sized and dimensioned such that it is incapable of passing through the block hole 44 of the most proximal block component 38. A screw head spring 56 is disposed within the screw head flange 55 and is in abutment with the screw head member 52. The screw head spring 56 places a constant force against the screw head member 52.

As illustrated in FIGS. 2 and 3, the second opposed end 50 of the actuator screw 46 has a crimped portion 58 that prevents the second opposed end 50 of the actuator screw 46 from passing into the block component 38 that is disposed most proximal to the second opposed end 50 of the actuator screw 46. The crimped portion 58 prevents the retainer assembly 10 from being disassembled from the second opposed end 50.

Preferably, the retainer assembly 10 further includes at least one retainer clip 60 that is and is sized and dimensioned to fit within the Ushaped guide rail 16. In the embodiment illustrated in the drawings, the retainer assembly 10 has two retainer clips 60. As illustrated in FIG. 1, each retainer clip 60 has a generally U-shaped internal surface which defines a clip opening 62 that is sized and dimensioned to accommodate the actuator screw 46. Each retainer clip 60 has an external clip surface which comprises one planar clip surface 64 that is disposed in parallel and proximal to the internal surface 26 of the slot abutment wall 22. The external surface of the retainer clip 60 also includes two angled planar surfaces 66 which extend in part through one set of the opposed side wall openings 30. The retainer clips 60 have a width that is slightly less than the width of the side wall openings, such that the retainer clips 60 are free to move back and forth a short distance within the side wall openings.

As illustrated in FIG. 1, the retainer clips 60 function to secure the expansion assembly 18 to guide rail 16. In this embodiment, the elongate actuator screw 46 extends through the block holes 44 in the block components 38 and through the retainer clip 60 in order to align the block components 38 and secure the block components 38 to the guide rail 16.

The invention also includes a method of reversibly mounting a panel 12 in a housing slot 14 comprising the steps of selecting the retainer assembly 10 described herein, attaching at least one retainer assembly 10 to a panel 12 such that the reward wall of the retainer assembly 10 is proximal to the panel 12 and the slot abutment wall 22 of the guide rail 16 is spaced apart from the panel 12, adjusting the expansion actuator 20 such that the width between the forward wall 32 and the rearward wall 34 of the expansion assembly 18 is contracted, sliding the panel 12 into a housing slot 14 having two spaced apart and parallel housing slot 14 walls such that a portion of the panel 12 is proximal to one housing slot 14 wall and the external surface 24 of the slot abutment wall 22 is disposed proximal to the opposing housing slot 14 wall, and adjusting the expansion actuator 20 such that the width between the forward wall 32 and the rearward wall 34 of the expansion assembly 18 is expanded until the external surface 24 of the slot abutment wall 22 guide rail 16 is pressed tightly against the housing slot 14 and the panel 12 is firmly retained within the housing slot 14.

In a preferred embodiment, there are two retainer assemblies 10 attached to the panel 12. In another preferred embodiment, the retainer assembly 10 is mounted to a panel 12 that is adapted to have a circuit board attached thereto.

In operation, turning the actuator screw 46 in one direction causes the threaded block component 38 to move towards the screw head member 52 such that the distance between the screw head member 52 and the threaded block component 38 is reduced and at least two block components 38 in sliding contact move toward each other. This causes the distance between at least a portion of the forward wall 32 and at least a portion of the rearward wall 34 to increase so that the forward wall 32 of the expansion assembly 18 places a force upon the slot abutment wall 22 of the guide rail 16. In response, the slot abutment wall 22 uniformly moves away from the rearward wall 34 of the expansion assembly 18.

Having thus described the invention, it should be apparent that numerous structural modifications and adaptations may be resorted to without departing from the scope and fair meaning of the instant invention as set forth hereinabove and as described hereinbelow by the claims.

What is claimed is:

1. A retainer assembly adapted to attach to a panel wherein the panel is reversibly mountable within a housing slot, the retainer assembly comprising:
    a) an elongated guide rail, the guide rail comprising a slot abutment wall having a continuous external surface and an opposed internal surface;
    b) an expansion assembly comprising a forward wall and a rearward wall, the forward wall being spaced apart from the rearward wall by a width, the forward wall being disposed proximate to the internal surface of the guide rail;
    c) the rearward wall of the expansion assembly including means for attaching the rear wall in abutment with a panel; and
    d) an expansion actuator for alternatively expanding and contracting the width between the forward wall and the rearward wall of the expansion assembly;
    whereby, when the retainer assembly is attached to a panel with the rearward wall of the expansion assembly disposed in abutment with the panel and when the panel is disposed within a housing slot with the external surface of the guide rail disposed proximate to the housing slot, the panel can be firmly retained within the housing slot by expanding the width between the forward wall and the rearward wall of the expansion assembly until the external surface of the slot abutment wall of the guide rail is pressed tightly against the housing slot.

2. The retainer assembly of claim 1 wherein the guide rail includes two opposing side walls that are attached to the slot abutment wall such that the guide rail is substantially U-shaped in cross-section.

3. The retainer assembly of claim 1 wherein the width of the slot abutment wall is between about 0.20 inches and about 1.0 inches and the width of each side wall is between about 0.20 inches and about 1.0 inches in width.

4. The retainer assembly of claim 1 wherein the guide rail and at least portions of the expansion assembly are formed of a thermally conductive material.

5. The retainer assembly of claim 4 wherein the thermally conductive material is a metal or metal alloy.

6. The retainer assembly of claim 1 wherein the expansion assembly and the guide rail include an anodized surface coating.

7. The retainer assembly of claim 1 wherein the means for attaching the rearward wall comprises threaded holes for receiving a screw.

8. The retainer assembly of claim 1 wherein the retainer assembly is mounted to a panel that is adapted to have a circuit board attached thereto.

9. The retainer assembly of claim 8 wherein two retainer assemblies are mounted to the panel.

10. The retainer assembly of claim 1 wherein the expansion assembly comprises slidably engaging wedged block components, each block component having a forward face and a spaced apart rearward face, wherein the forward wall of the expansion assembly is formed at least in part by the forward face of at least one block component, and the rearward wall of the expansion assembly is formed at least in part by the rearward face of at least one block component.

11. The retainer assembly of claim 1 wherein the forward wall of the expansion assembly is spaced apart from the rearward wall by between about 0.2 inches and about 1.0 inches.

12. A retainer assembly adapted to attach to a panel that reversibly mounts within a housing slot, the retainer assembly comprising:
   a) an elongated guide rail, the guide rail having a slot abutment wall and two opposing side walls attached thereto so as to make the guide rail substantially U-shaped in cross-section, the slot abutment wall having a continuous external surface and an opposed internal surface;
   b) an expansion assembly having a variable width, the expansion assembly adapted to apply force to the internal surface of the slot abutment wall, the expansion assembly comprising slidably engaging wedged block components, each block component being substantially rectangular in cross-section and disposed at least in-part within the substantially U-shaped guide rail, each block component having a forward face and a spaced apart rearward face, the forward face being disposed proximal to the internal surface of the slot abutment wall;
   c) the rearward face of at least one block component including means for attachment to a panel; and
   d) an expansion actuator in operable connection with the expansion assembly that, when engaged, causes at least two wedged block components to slide together such that the forward faces of two block components and the rearward faces of at least two block components are discontinuous and the width of the expansion assembly is increased;
   whereby when the retainer assembly is attached to a panel disposed within a housing slot, the width of the expansion assembly can be increased in response to the expansion actuator so as to force the slot abutment wall of the guide rail away from the panel and firmly retain the panel within the slot of the housing.

13. The retainer assembly of claim 12 wherein the block components are generally rectangular in cross-section and have two opposing end surfaces, at least two block components having at least one wedged end surface, wherein a wedged end surface of one block component is in sliding contact with the wedged end surface of another block component, each block component having a hole extending longitudinally through the block component, at least one block component having a threaded hole, at least one block component having a substantially circular hole, at least one block component having an elongated hole, at least one block component having mounting members for attaching the retainer assembly to a panel.

14. The retainer assembly of claim 12 wherein the expansion actuator comprises an actuator screw having a first opposed end and a second opposed end, the first opposed end of the actuator screw comprising a screw head member that is incapable of passing through the hole of the most proximal block component, the second opposed end having a crimped portion.

15. The retainer assembly of claim 12 wherein the side walls have at least one set of opposed side wall openings.

16. The retainer assembly of claim 15 further comprising at least one retainer clip inserted into the at least one set of side wall openings of the guide rail.

17. The retainer assembly of claim 16 wherein the expansion actuator comprises a elongate actuator screw extending through holes in the block components and through the retainer clip, the actuator screw having threads that are sized and dimensioned to cooperate with the threaded block component, the actuator screw having a first opposed end and a second opposed end, the first opposed end of the actuator screw comprising a screw head member that is incapable of passing through the hole of the most proximal block component, the second opposed end having a crimped portion, whereby turning the actuator screw in one direction causes the threaded block component to move towards the screw head such that the distance between the screw head and the threaded block component is reduced and at least two block components in sliding contact move toward each other such that the distance between at least a portion of the forward face and at least a portion of the rearward face increases and the forward face of the expansion assembly places a force upon the slot abutment wall of the guide rail such that the slot abutment wall uniformly moves away from the rearward face of the expansion assembly.

18. A method of reversibly mounting a panel in a housing slot comprising the steps of:
   a) selecting the retainer assembly of claim 1;
   b) attaching at least one retainer assembly to a panel such that the reward wall of the retainer assembly is proximal to the panel and the slot abutment wall of the guide rail is spaced apart from the panel;
   c) adjusting the expansion actuator such that the width between the forward wall and the rearward wall of the expansion assembly is contracted;
   d) sliding the panel into a housing slot having two spaced apart is and parallel housing slot walls such that a portion of the panel is proximal to one housing slot wall and the external surface of the slot abutment wall is disposed proximal to the opposing housing slot wall;
   e) adjusting the expansion actuator such that the width between the forward wall and the rearward wall of the expansion assembly is expanded until the external surface of the slot abutment wall guide rail is pressed tightly against the housing slot and the panel is firmly retained within the housing slot.

19. The method of claim 18 wherein there are two retainer assemblies attached to the panel.

20. The retainer assembly of claim 18 wherein the retainer assembly is mounted to a panel that is adapted to have a circuit board attached thereto.

\* \* \* \* \*